US010886265B2

(12) United States Patent
Penumatcha et al.

(10) Patent No.: US 10,886,265 B2
(45) Date of Patent: Jan. 5, 2021

(54) INTEGRATED CIRCUIT DEVICE WITH A TWO-DIMENSIONAL SEMICONDUCTOR MATERIAL AND A DIELECTRIC MATERIAL THAT INCLUDES FIXED CHARGES

(71) Applicant: Intel Corporation, Santa Clara, CA (US)

(72) Inventors: Ashish Verma Penumatcha, Hillsboro, OR (US); Uygar Avci, Portland, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 94 days.

(21) Appl. No.: 16/002,656

(22) Filed: Jun. 7, 2018

(65) Prior Publication Data

US 2019/0378834 A1   Dec. 12, 2019

(51) Int. Cl.
*H01L 27/06* (2006.01)
*H01L 21/8234* (2006.01)
*H01L 29/66* (2006.01)
*H01L 29/78* (2006.01)
*H01L 27/088* (2006.01)

(52) U.S. Cl.
CPC .. *H01L 27/0617* (2013.01); *H01L 21/823431* (2013.01); *H01L 27/0886* (2013.01); *H01L 29/66795* (2013.01); *H01L 29/785* (2013.01)

(58) Field of Classification Search
CPC ......... H01L 27/0617; H01L 21/823431; H01L 29/66795; H01L 29/785; H01L 27/0886; H01L 29/78696; H01L 29/778; H01L 29/78681; H01L 29/78603; H01L 21/043; H01L 29/45; H01L 29/78618; H01L 29/1606; H01L 29/78684; H01L 21/02568; H01L 21/02417; H01L 21/02376; H01L 23/53276; H01L 45/149; H01L 29/16–1608; H01L 29/66045; C01B 32/182–198; C01B 2204/00–32; Y10S 977/734–753

See application file for complete search history.

(56) References Cited

U.S. PATENT DOCUMENTS

2014/0061590 A1* 3/2014 Lee .................... H01L 29/78684
                                                              257/29
2017/0244055 A1* 8/2017 Bangsaruntip .... H01L 29/42376
2017/0338311 A1* 11/2017 Lee ...................... H01L 29/1606

OTHER PUBLICATIONS

Wikipedia, "Non-stoichiometric compound", Mar. 15, 2018, pp. 1-4, https://en.wikipedia.org/wiki/Non-stoichiometric_compound.

(Continued)

*Primary Examiner* — Nelson Garces
(74) *Attorney, Agent, or Firm* — Trop, Pruner & Hu P.C.

(57) ABSTRACT

An embodiment includes an apparatus comprising: a dielectric material including fixed charges, the fixed charges each having a first polarity; a channel comprising a channel material, the channel material including a 2-dimensional (2D) material; a drain node; and a source node including a source material, the source material including at least one of the 2D material and an additional 2D material; wherein the source material: (a) includes charges each having a second polarity that is opposite the first polarity, (b) directly contacts the dielectric material. Other embodiments are described herein.

25 Claims, 14 Drawing Sheets

(56) References Cited

OTHER PUBLICATIONS

Wikipedia, "Transition metal dichalcogenide monolayers", Mar. 15, 2018, pp. 1-17, https://en.wikipedia.org/wiki/Transition_metal_dichalcogenide_monolayers.

Chen et al, "Air stable n-doping of WSe2 by silicon nitride thin films with tunable fixed charge density", APL Materials 2, Aug. 5, 2014, pp. 092504 to 092504-7.

* cited by examiner

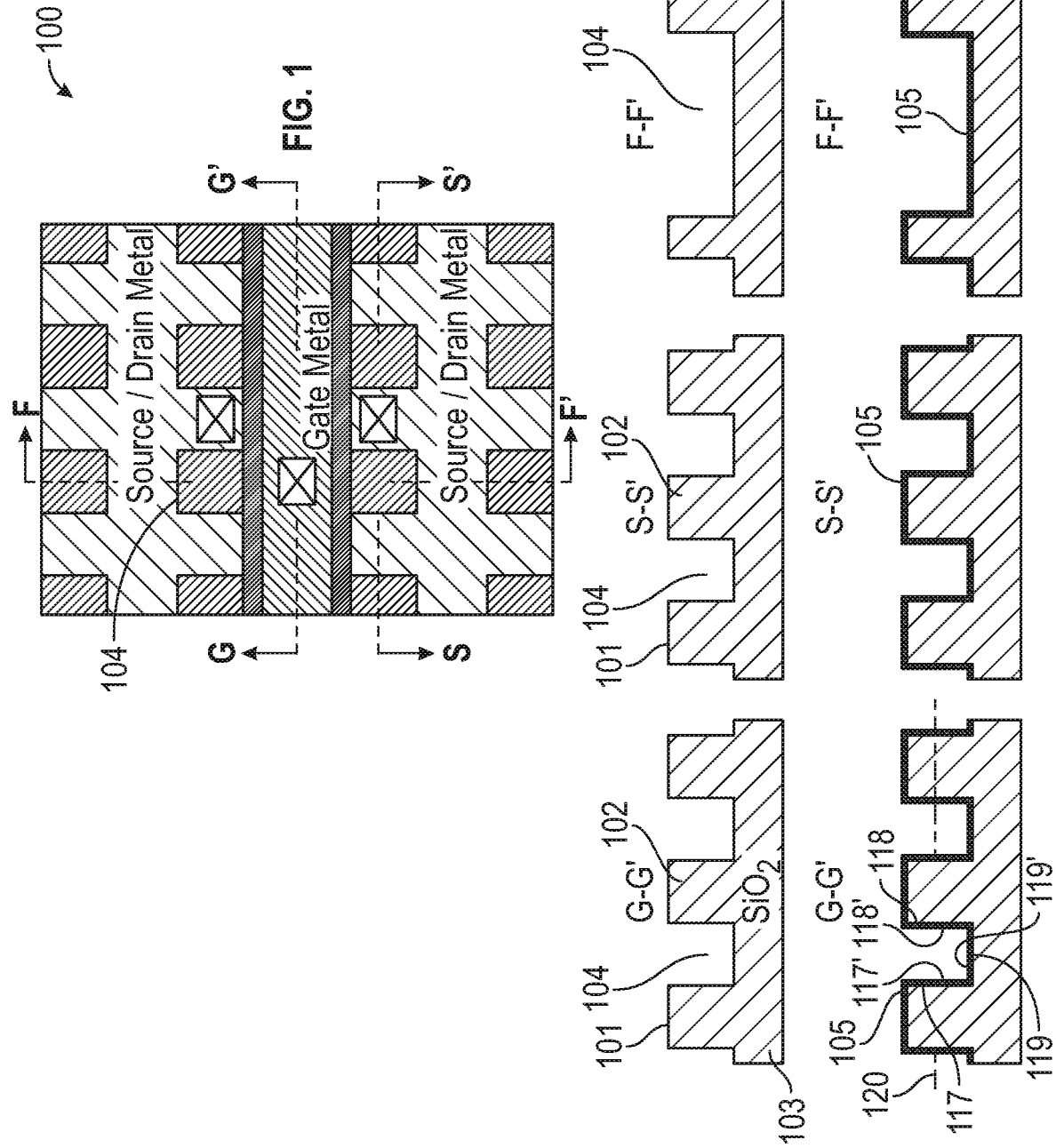

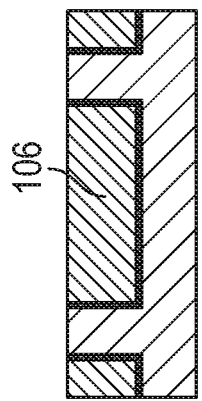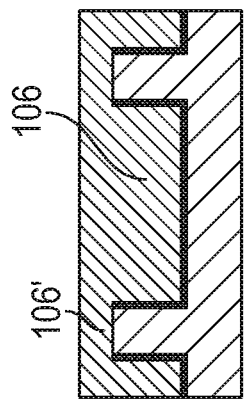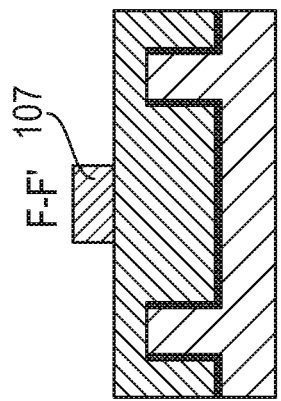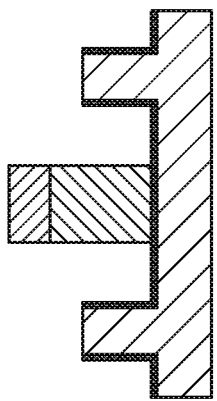
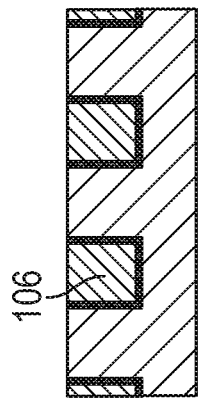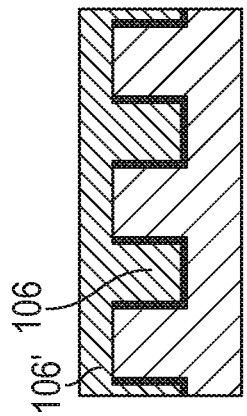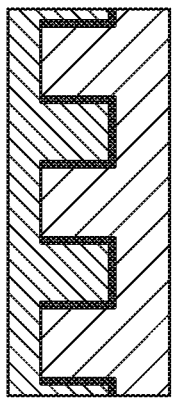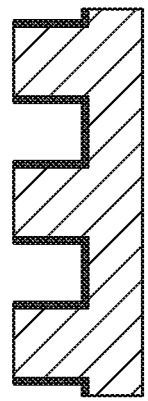
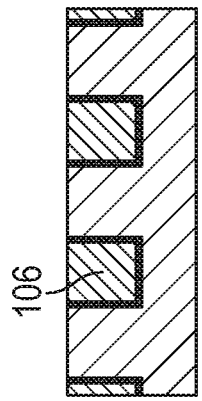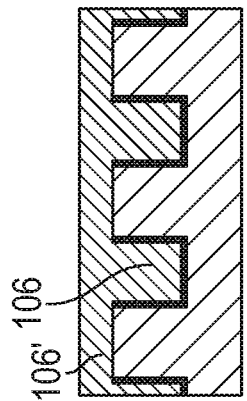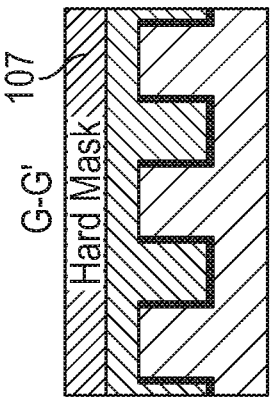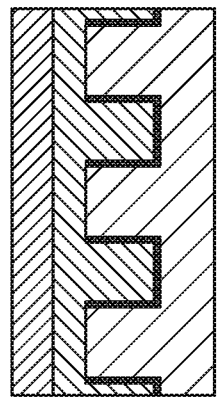
FIG. 1C  FIG. 1D  FIG. 1E  FIG. 1F

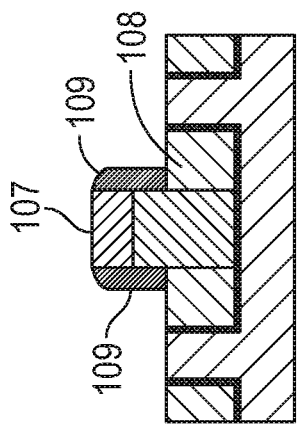
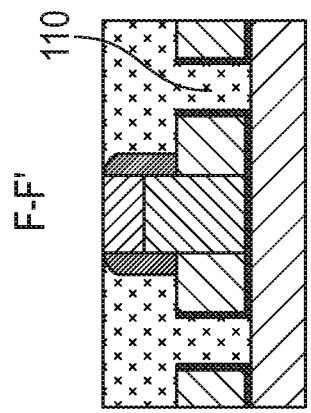
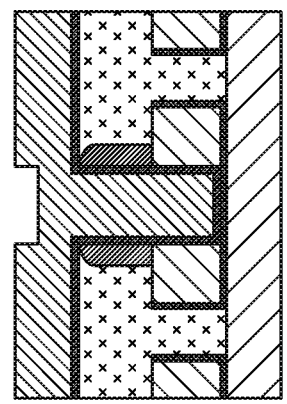
FIG. 1J
FIG. 1K
FIG. 1L
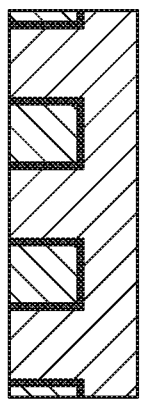
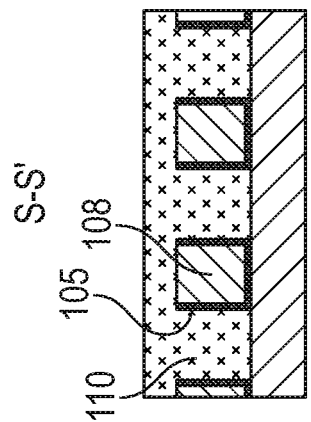
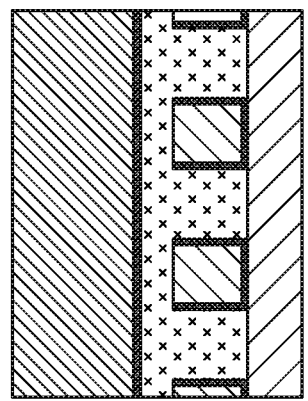
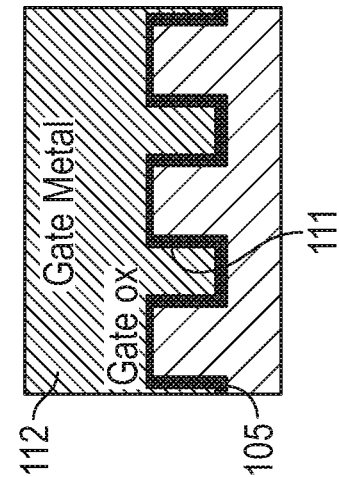

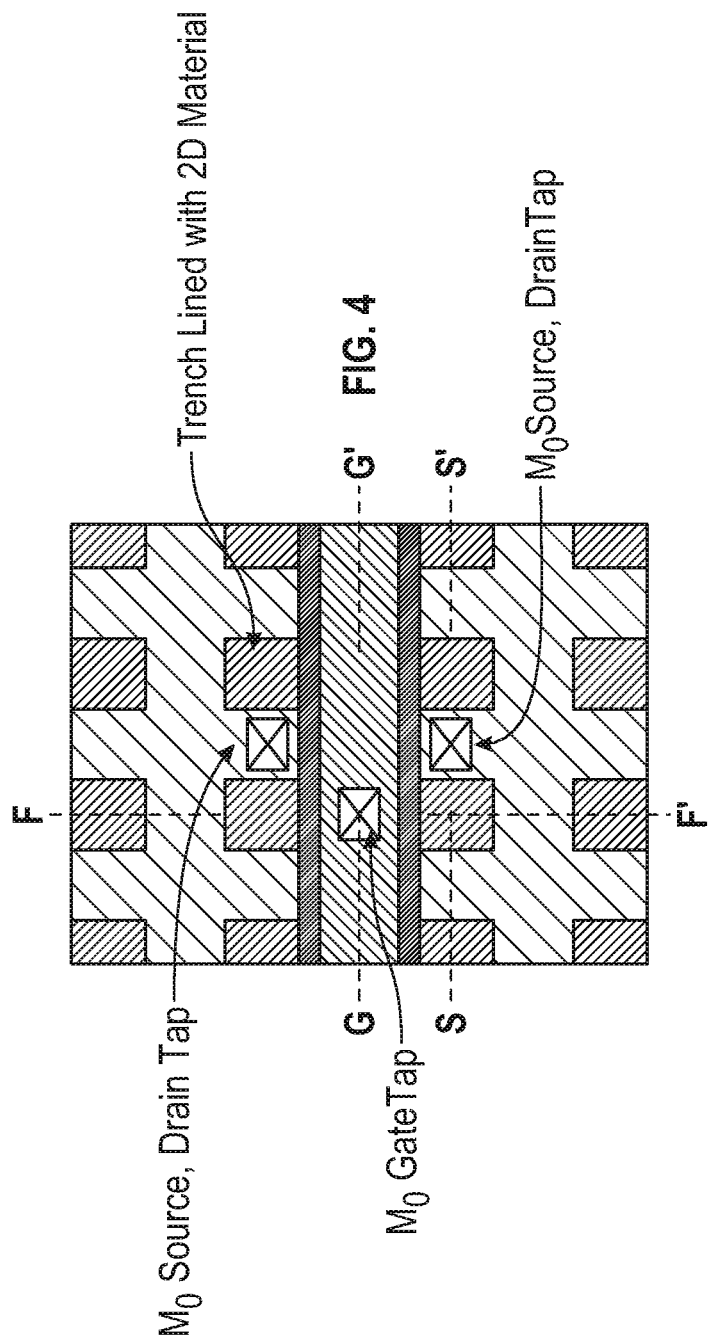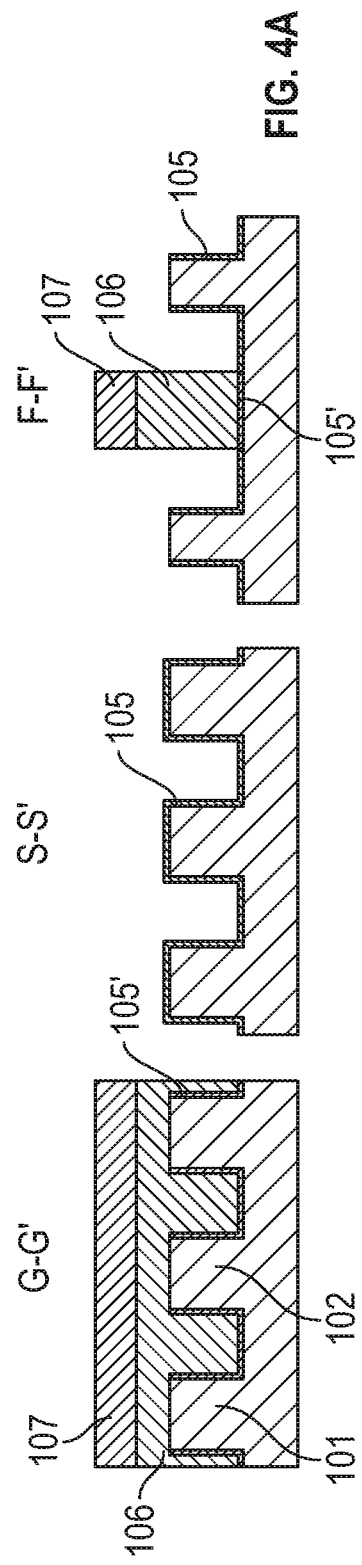

INTEGRATED CIRCUIT DEVICE WITH A TWO-DIMENSIONAL SEMICONDUCTOR MATERIAL AND A DIELECTRIC MATERIAL THAT INCLUDES FIXED CHARGES

TECHNICAL FIELD

Embodiments of the invention are in the field of semiconductor devices and, in particular, transistors.

BACKGROUND

A FinFET is a transistor built around a vertical fin of semiconductor material (referred to as the "fin"). The transistor includes the standard field effect transistor (FET) nodes/components: a gate, a gate dielectric, a source region, and a drain region.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

FIG. 4 provides a top view of a 2D transistor in an embodiment. FIGS. 4A-4E show a process for manufacturing the embodiment of FIG. 4.

DETAILED DESCRIPTION

Figure 1G:
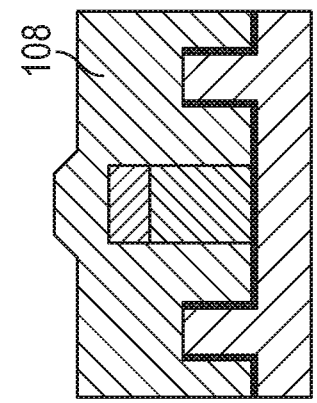
FIG. 1 provides a top view of a 2D transistor in an embodiment.
FIGS. 1A-1N show a process for manufacturing the embodiment of FIG. 1.
Figure 1G:
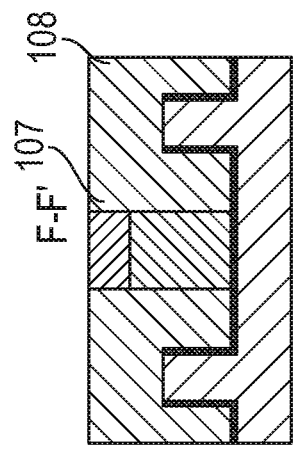
Figure 1G:
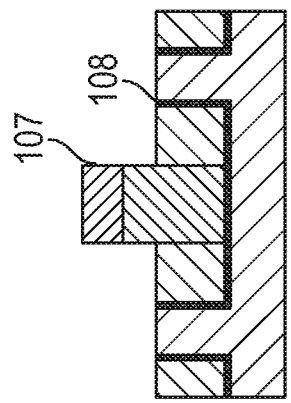

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments (e.g., walls may not be exactly orthogonal to one another in actual fabricated devices). Moreover, the drawings may only show the structures useful to understand the illustrated embodiments. Additional structures known in the art may not have been included to maintain the clarity of the drawings. For example, not every layer (e.g., barrier layer, seed layer, etch stop layer) of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Applicant determined transistor development is driven, at least in part, by decreasing the channel length of a transistor while also improving the speed of the transistor and lowering the power consumption of the transistor. Applicant further determined conventional finFETs face significant challenges in terms of scalability.

For example, thinning of the channel has been proposed to scale (decrease) channel length (Lg) using polygate devices such as fin-FETs and nanowires or nanoribbons. However, Applicant determined there is a limit to this thinning where channel properties are affected negatively. Specifically, when a conventional bulk semiconductor is thinned below 5 nm the following issues arise: (a) large band gap due to quantum confinement, and (b) low-mobility due to surface roughness. To scale Lg to 5 nm and below the channel thickness may need to be about 1 to 2 nm, which degrades the transport properties of the channel to unacceptable levels. Other bulk materials (e.g., III-V, IV) have been proposed as silicon replacements for the channel, but they fare worse than silicon in the thin body limit. Applicant further determined it is difficult to build tunnel-FETs (TFET) (a variation of the MOSFET that requires even tighter gate control to enable band-to-band tunneling for low voltage operation) with these bulk materials because of same physics explained above. In addition, lattice matching may need to be taken into account to form defect free hetero-junctions with traditional bulk materials.

However, Applicant determined the above constraints can be relaxed with embodiments that replace the silicon channel with a class of atomically-thin materials called two-dimensional materials (2D-materials). Embodiments with channels using such materials allow for adequate scaling of channel length while simultaneously allowing for such transistors to be reliably manufactured in large quantities (billions of transistors).

More specifically, embodiments that use an atomically thin channel allow one to achieve excellent electrostatics, thereby allowing the gate to control channel-potential even for sub-7 nm channel lengths without having to resort to multiple-gate architecture (e.g., polygate devices such as nanowires).

To implement such 2D-based transistors, Applicant identified at least the following three issues that needed to be addressed to harvest the superior electrostatics offered by 2D materials.

First, atomically-thin materials cannot be reliably doped using implantation or other substitutional doping techniques. This makes the formation of low-resistance contacts (lowering source/drain resistance, which affects current drivability of the transistor) challenging. Thus, conventional transistors with source or drain thickness greater than 10 nm do not face the same doping related issues as transistors with source or drain thickness less than 10 nm. However, an embodiment forms a doped-oxide layer (e.g., materials with charge defects) in close proximity to the source/drain regions of the TMD material. This doped dielectric induces a high carrier concentration in the source/drain regions and lowers contact resistance, thereby increasing current drivability of the transistor.

Second, building planar transistors with 2D materials lowers the current per unit gate-width because the mobility of these materials is not as high as conventional silicon technology. Using a FinFET architecture can improve the current per unit gate-width by using multiple tall-fins patterned with a fine-pitch. However, an embodiment utilizes an integration flow to make 2D material transistors with a "U" shaped structure using a self-aligned process. The structure allows more current per unit gate-width than is possible using a large fin height with a tight-pitch. Thus, due to the increased area advantage (i.e., interface between gate and channel) and improved electrostatic channel control, use of nanowire architectures and the like may not be necessary.

Third, to build hetero-structure (e.g., where the source and channel include different materials) TFETs with 2D materials, such TFETs may be formed using a manufacturing process where the gate is substantially aligned with the channel-source junction (with minimal overlay of the gate over the source) to harvest the potential low-voltage operation of a 2D heterojunction. As will be addressed below, embodiments address this issue. For example, an embodiment uses a process to grow different materials in the source and drain. The self-aligned nature of the process promotes proper gate alignment to the source-channel junction. The process enables the formation of doped contacts.

More generally, embodiments addressed herein allow for smaller channel length transistors (that have increased speed and lower power consumption) by replacing the silicon channel with a new class of atomically thin materials called 2D-materials. Further, these embodiments help overcome the challenge of making low resistance contacts to these 2D-materials. Also, an embodiment enables manufacture of heterojunction TFETs to enable low-power system on chip (SOC) systems and highly parallelizable energy efficient multi-core systems.

FIG. 1 provides a top view of a 2D transistor in an embodiment. Figure provides views G-G', S-S', and F-F'. FIGS. 1A-1N show a process for manufacturing the embodiment of FIG. 1 while providing cross-sections for G-G', S-S', and F-F'. FIG. 2 includes an embodiment of a method 200 for manufacturing the 2D transistor of FIGS. 1 and 1A-1N. These figures are now discussed with 1XX numbers addressing FIGS. 1 and 1A-1N and 2XX numbers addressing FIG. 2.

In FIG. 2 block 201 (see also FIG. 1A) includes forming two fins 101, 102 from a first dielectric material 103 (e.g., silicon dioxide), the two fins defining a trench 104.

Block 202 (see also FIG. 1B) includes forming a first material within a channel portion of the trench, the first material including a 2D material 105. This may occur simultaneously with block 203, which includes forming a second material within a source portion of the trench, the second material including the 2D material 105. Thus, for process 200 the same 2D material may be provided in source, channel, and drain areas of the trench 104. However, an embodiment provides for a change in process 200 (e.g., see process 300 of FIG. 3 addressed below) with the changed process providing heterojunction devices.

FIG. 1C includes forming polysilicon 106 within trench 104, polishing the polysilicon, and removing 2D material from tops of the fins 101, 102. FIG. 1D includes forming additional polysilicon 106' on the previously polished polysilicon 106. FIG. 1E includes forming a hardmask 107 over the channel area. FIG. 1F includes etching the polysilicon 106, 106' from areas not protected by hardmask 107.

Block 204 (see also FIG. 1G) includes forming a second dielectric material 108 on the second material and within the source portion of the trench, wherein the second dielectric material is not formed within the channel portion of the trench. For example, this may include a dielectric with fixed charges such as $SiN_x$.

Figure 1H:
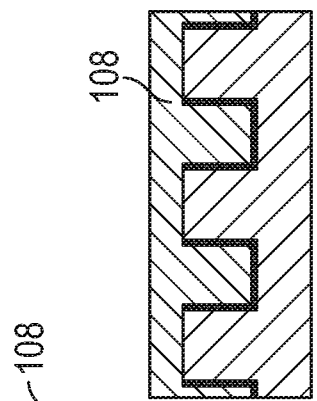
Figure 1H:
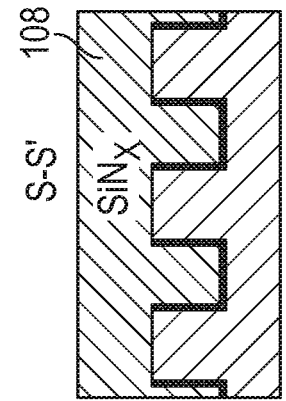
Figure 1H:
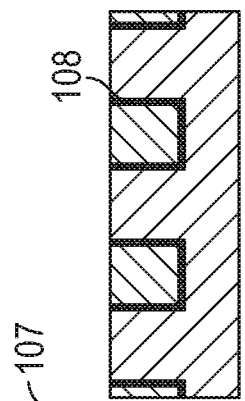
Figure 1I:
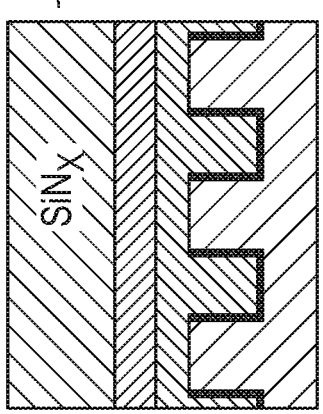
Figure 1I:
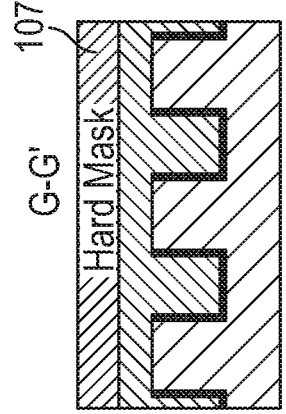
Figure 2:
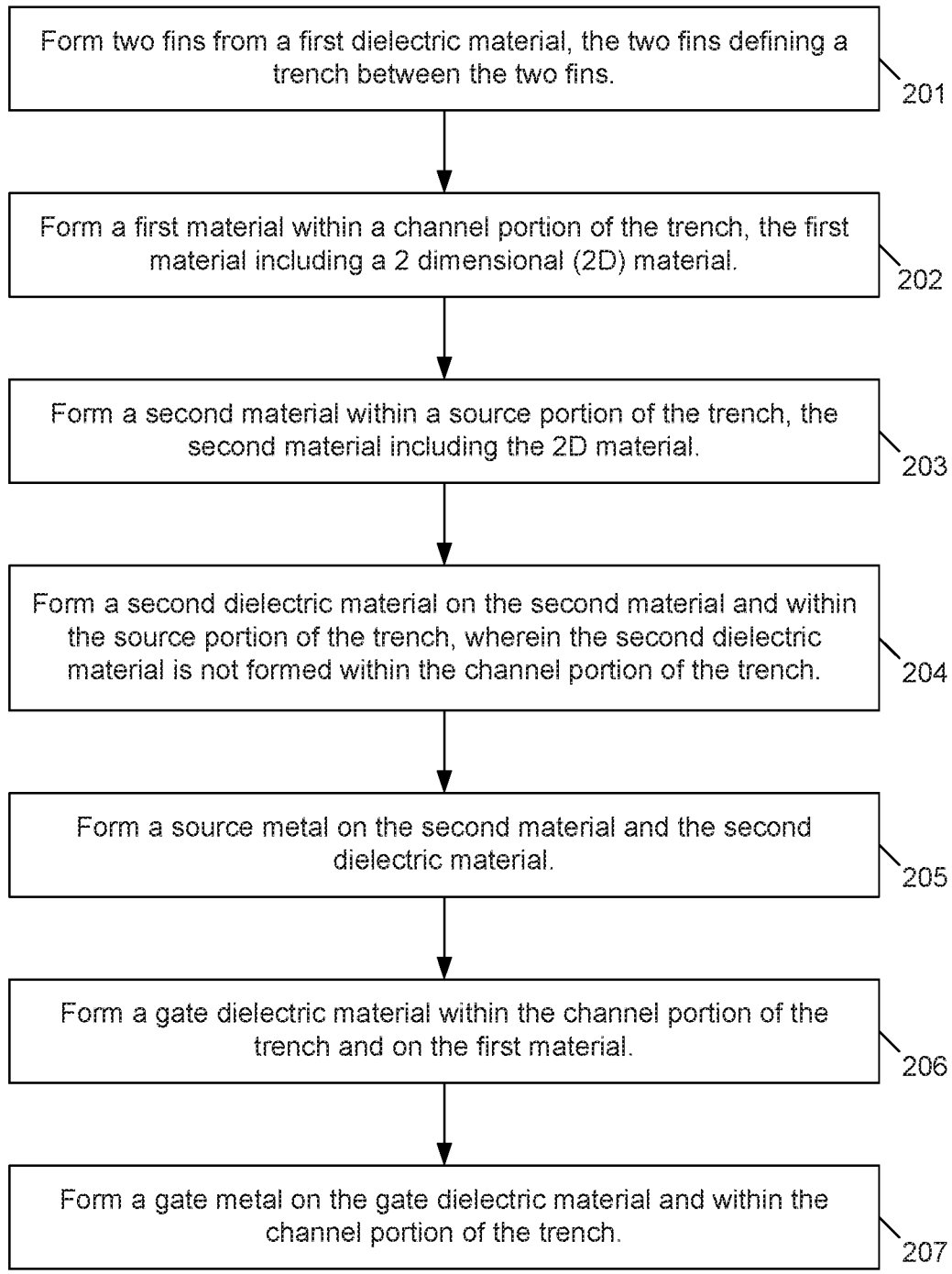
FIG. 2 includes an embodiment of a method for manufacturing a 2D transistor.

FIG. 1H includes planarizing the second dielectric 108 to be at the same vertical level as the hardmask 107. FIG. 1I includes etching the second dielectric 108 to be as the same vertical level as the top surfaces of the fins 101, 102. FIG. 1J includes forming spacers (e.g., silicon dioxide) 109 using conventional techniques.

Block 205 (see also FIG. 1K) includes forming a source metal 110 on the second material (2D material of the source area) 105 and the second dielectric material 108. The dielectric has fixed charges and those fixed charges cause doping in the source 2D material. FIG. 1K also addresses etching the fins to form voids that are then filled with source/drain metal 110.

Block 206 includes forming a gate dielectric material 111 within the channel portion of the trench 104 and on the first material 105. Block 207 includes forming a gate metal 112 on the gate dielectric material 111 and within the channel portion of the trench. FIG. 1L provides more detail in removing the hard mask, polysilicon 106, and depositing gate dielectric 111 and gate metal 112.

Figure 1M:
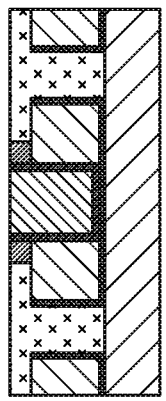
Figure 1M:
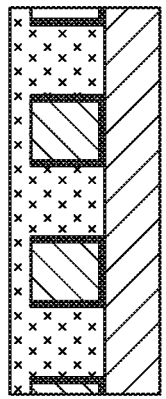
Figure 1M:
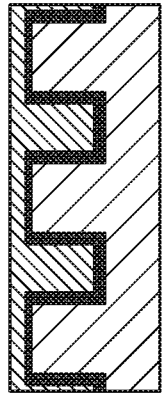
Figure 1N:
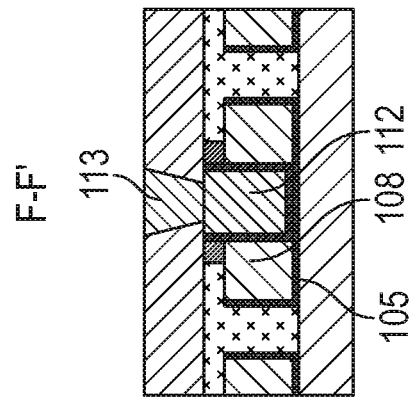
Figure 1N:
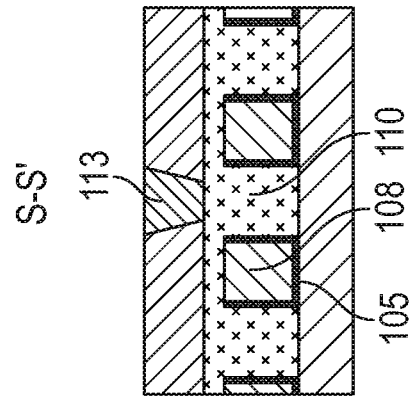
Figure 1N:
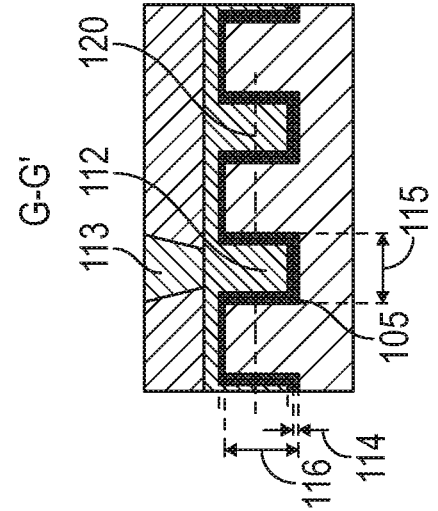

FIG. 1M includes chemical mechanical planarization (CMP). FIG. 1N includes forming contacts 113 for the source, drain, and gate.

FIGS. 1 and 1N are now addressed more fully. Apparatus 100 comprises a dielectric material 108 including fixed charges, the fixed charges each having a first polarity. A channel comprises a channel material, the channel material including 2D material 105. The source node includes a source material including the 2D material 105. The source material includes charges each having a second polarity that is opposite the first polarity. The 2D material 105 in the source area directly contacts the dielectric material 108. The thickness 114 of the 2D material included in the source material is less than 10 nm. However, in other embodiments the thickness is less than 20, 18, 16, 14, 12, 8, or 6 nm.

As mentioned above, with a source 2D material so thin (e.g., less than 10 nm) ion implant doping is most difficult. However, the arrangement of apparatus 100 allows for surface charge transfer doping. This surface charge transfer doping constitutes remote electrostatic doping that is different from traditional substitutional doping seen in traditional bulk semiconductors. For example, using $SiN_x$ (instead of stoichiometric $Si_3N_4$) provides fixed charges within dielectric 108. These charges (e.g., positive center charges) cause electrons to gather in the 2D material of the source/drain 104. As a result, typical metals (e.g., copper or gold) may be used for source/drain metal 110 while still providing a low resistance contact system. This lowering of source/drain resistance (due to doping of source/drain 2D materials) positively affects current drivability of the transistor. Thus, in some embodiments the source material 105 is electrostatically doped to be n- or p-type depending on the polarity of the fixed charge in layer 108.

Other ways of appreciating the thinness of material 105 are as follows. In an embodiment the thickness of the 2D material in the source material is substantially equal to the thickness of the 2D material included in the channel material. In an embodiment, the thickness of the 2D material included in the channel material is equal to or less than 15 atoms. For example, in an embodiment the 2D material includes a transition metal dichalcogenide (TMD). The TMD includes at least one of (a) molybdenum and sulfur, (b) tungsten and sulfur, (c) tungsten and selenium, (d) molybdenum and tellurium, (e) tungsten and tellurium, (f) tin and sulfur, (g) tin and selenium, (h) hafnium and sulfur, (i) hafnium and selenium, (j) zirconium and sulfur, (k) zirconium and sulfur, and (l) combinations thereof. A monolayer of a TMD may be 3 atoms thick. Thus, 2D thickness 114 of 15 atoms may include approximately 5 monolayers of the TMD. In an embodiment, the 2D thickness 114 may be 10 nm or less. However, in other embodiments the 2D thickness 114 may be no more than 5, 15, 20, or 25 nm.

Again addressing the extreme scale of apparatus 100, in an embodiment a length of the channel is parallel to a long axis of the channel (see view F-F'), a width of the channel 115 is orthogonal to the length of the channel, and a height of the channel 116 is orthogonal to the length of the channel and the width of the channel, the long axis defining a length of the channel; the length of the channel is less than 10 nanometers; and the thickness of the 2D material is less than the height of the channel. At Lg of 10 nm or less, short channel effects are an issue addressed by the embodiment. In other embodiments Lg is less than 20, 18, 16, 14, 12, 8, or 6 nm.

Regarding the trench in greater detail, (see FIG. 1B) the trench 104 includes first 117, second 118, and third 119 walls; the first and second sidewalls are opposing sidewalls of the trench. The third wall couples the first sidewall to the second sidewall. The channel material 105 includes: (a) a first channel material portion 117' on the first wall, (b) a second channel material portion 118' on the second wall, and (c) a third channel material portion 119' on the third wall. The gate 112 (FIG. 1N) is between the first channel material portion and the second channel material portion. Axis 120 is orthogonal to the long axis and intersects the gate 112 and the first and second channel material portions 117, 118 but not the third channel material portion 119. Spacer dielectric 109 (FIGS. 1J and 1N) directly contacts both the gate dielectric 111 and the dielectric material 108.

While in above embodiments the 2D material includes TMD materials, in other embodiments material 105 may include at least one of phosphorene, graphene, silicene, and germanene. Further, while in apparatus 100 the source and channel material include the same 2D material, in other embodiments (see FIG. 3) the source material may include a 2D material and the channel material may include another 2D material that is not the 2D material (e.g., a heterojunction device). Heterojunction devices are an example where the source and/or drain nodes have a different material from the channel. Further, the source (and/or drain) and channel may include different phases of the same material. Regarding heterojunction devices, the drain material may include the same 2D material as either the source or the channel. For instance, the source and drain may have a first 2D material while the channel has a second 2D material.

Further regarding the drain node, the drain material (similar to the source material) may directly contact the dielectric material 108 and may include charges that each have a polarity opposite the charges in material 108.

In an embodiment the source node, the drain node, and the channel are included in a planar transistor. Plane 120 (which also depicts axis 120) is parallel to a long axis of the channel and intersects each of the source node, the drain node, and the channel. The planar transistor may have a "U" shape (see cross-section in FIG. 1N) for each of the source, channel, and drain.

Figure 3:
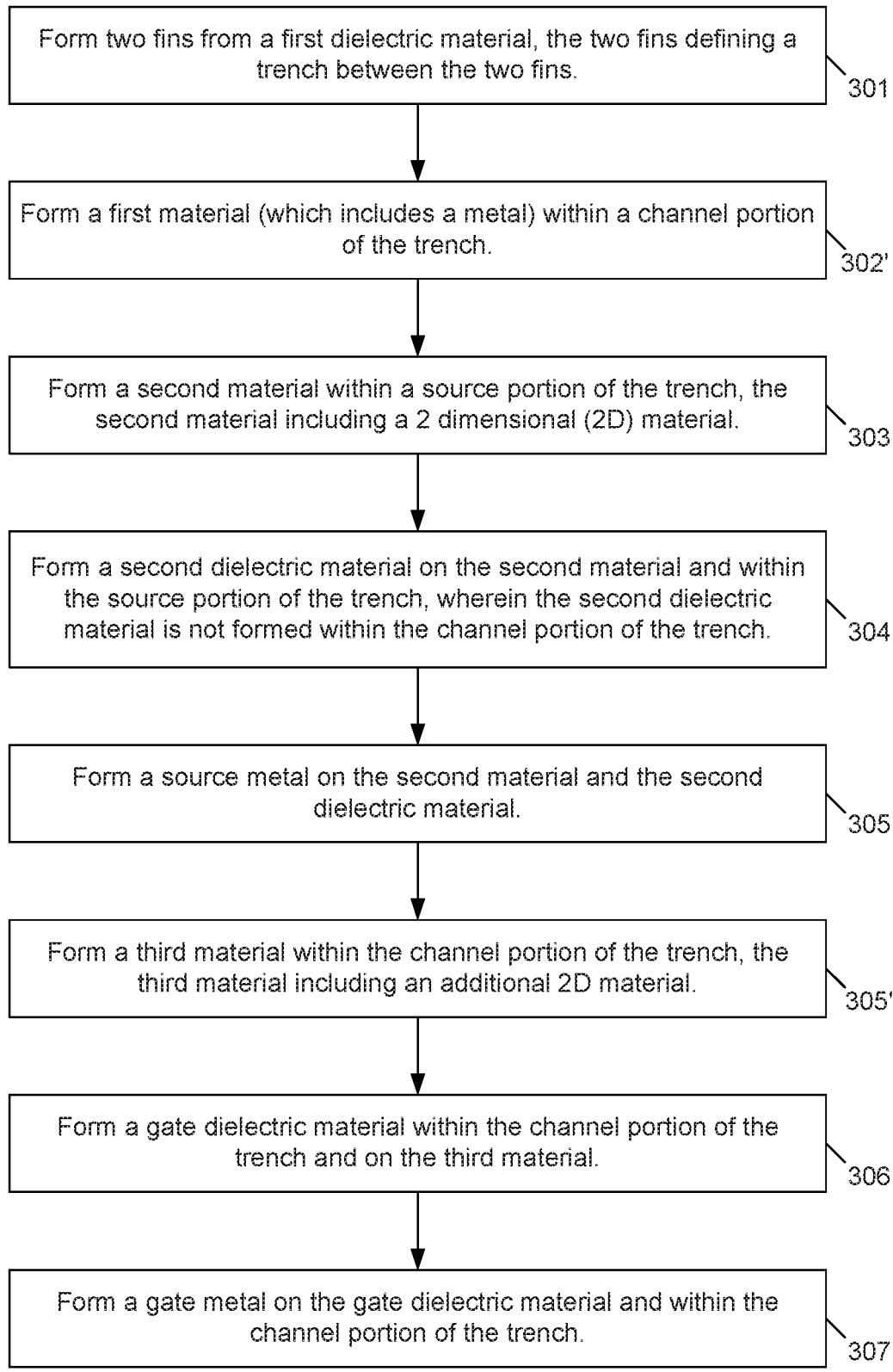
FIG. 3 includes an embodiment of a method for manufacturing a heterojunction 2D transistor.

FIG. 3 includes a process 300 for manufacturing a heterojunction device.

Block 301 includes forming two fins from a first dielectric material, the two fins defining a trench between the two fins. This is similar to FIG. 1A. However, block 302' includes forming a first material (which includes a metal) within a channel portion of the trench and block 303 includes forming a second material within a source portion of the trench, the second material including a 2D material. The first material may include, for example, the transition metal of a TMD (e.g., molybdenum, tungsten, hafnium, zirconium, and combinations thereof). If the end 2D material is graphene, for example, material 105' may be copper. Thus, after steps similar to those of FIGS. 1B-1E, FIG. 4A depicts fins 101, 102, 2D material 105, polysilicon 106, hardmask 107, and transition metal 105'.

Block 304 (see also FIG. 4B) includes forming a second dielectric material 108 on the second material 105 and within the source portion of the trench, wherein the second dielectric material is not formed within the channel portion of the trench.

Figure 4B:
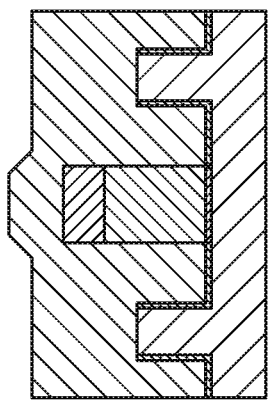
Figure 4B:
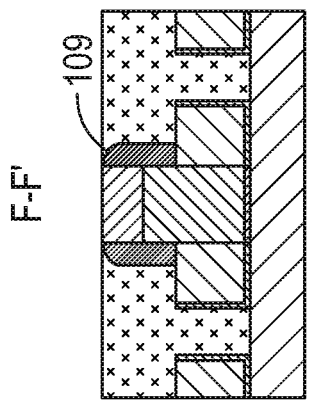
Figure 4B:
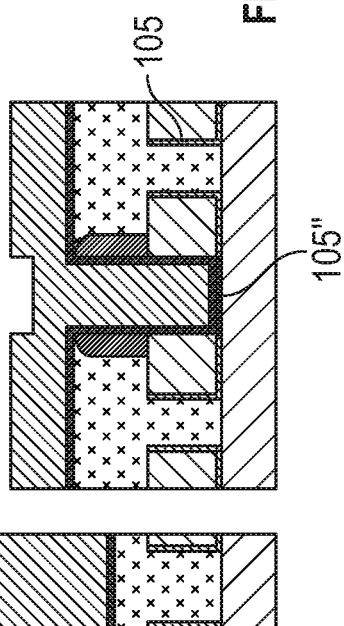
Figure 4C:
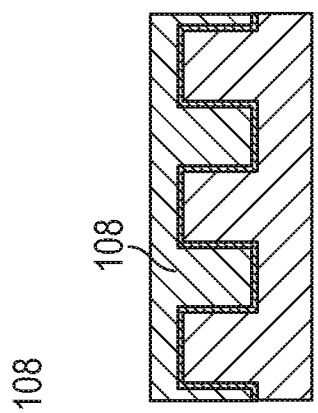
Figure 4C:
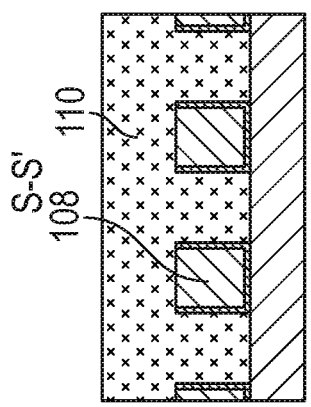
Figure 4C:
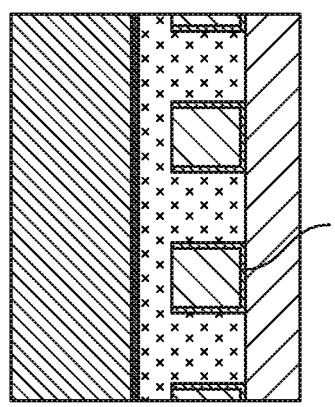

Block 305 (see also FIG. 4C) includes forming a source metal 110 on the second material 105 and the second dielectric material 108. FIG. 4C also includes forming a spacer 109 as described with FIG. 1J.

Figure 4D:
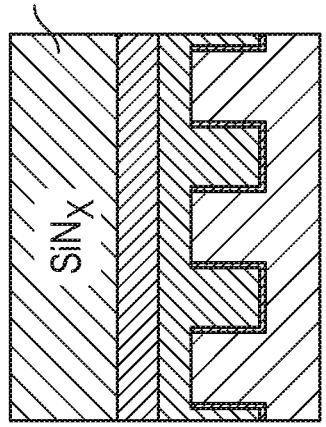
Figure 4D:
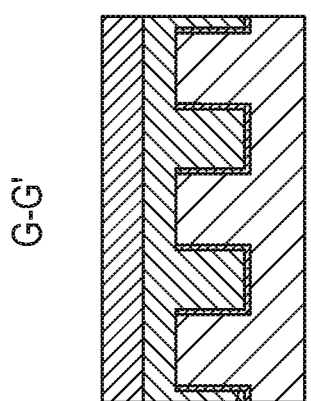
Figure 4D:
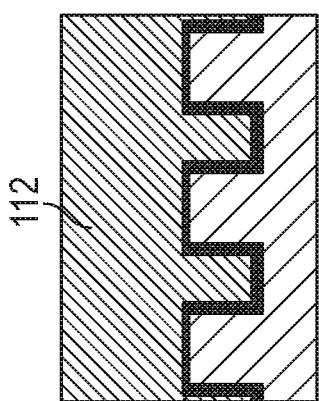

Block 305' (see also FIG. 4D) includes forming a third material 105" within the channel portion of the trench, the third material including an additional 2D material. Thus, if material 105' includes the transition metal of a TMD material then material 105" may include the TMD after the chalcogen component was added.

Figure 4E:
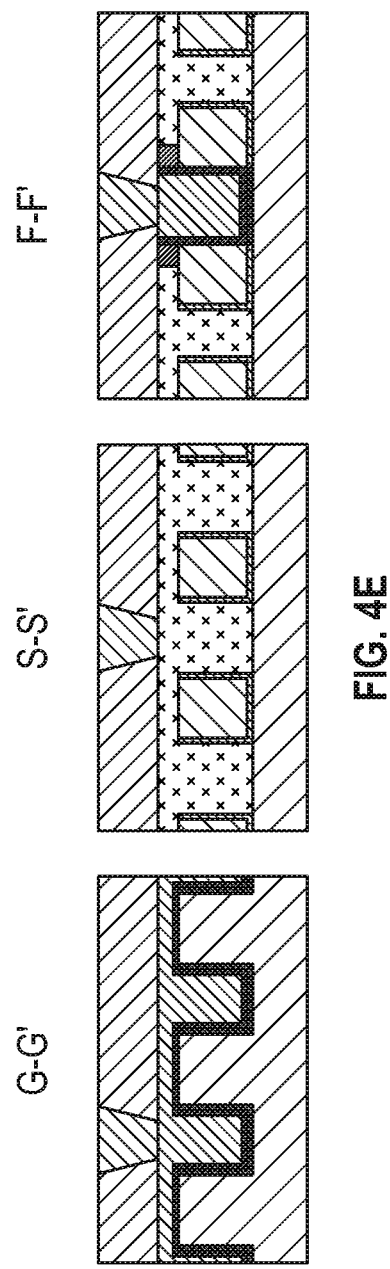

Block 306' (see also FIG. 4D) includes forming a gate dielectric material 111 within the channel portion of the trench and on the third material 105". Block 307 includes forming a gate metal 112 on the gate dielectric material 111 and within the channel portion of the trench. FIG. 4E includes contact formation.

Figure 8:
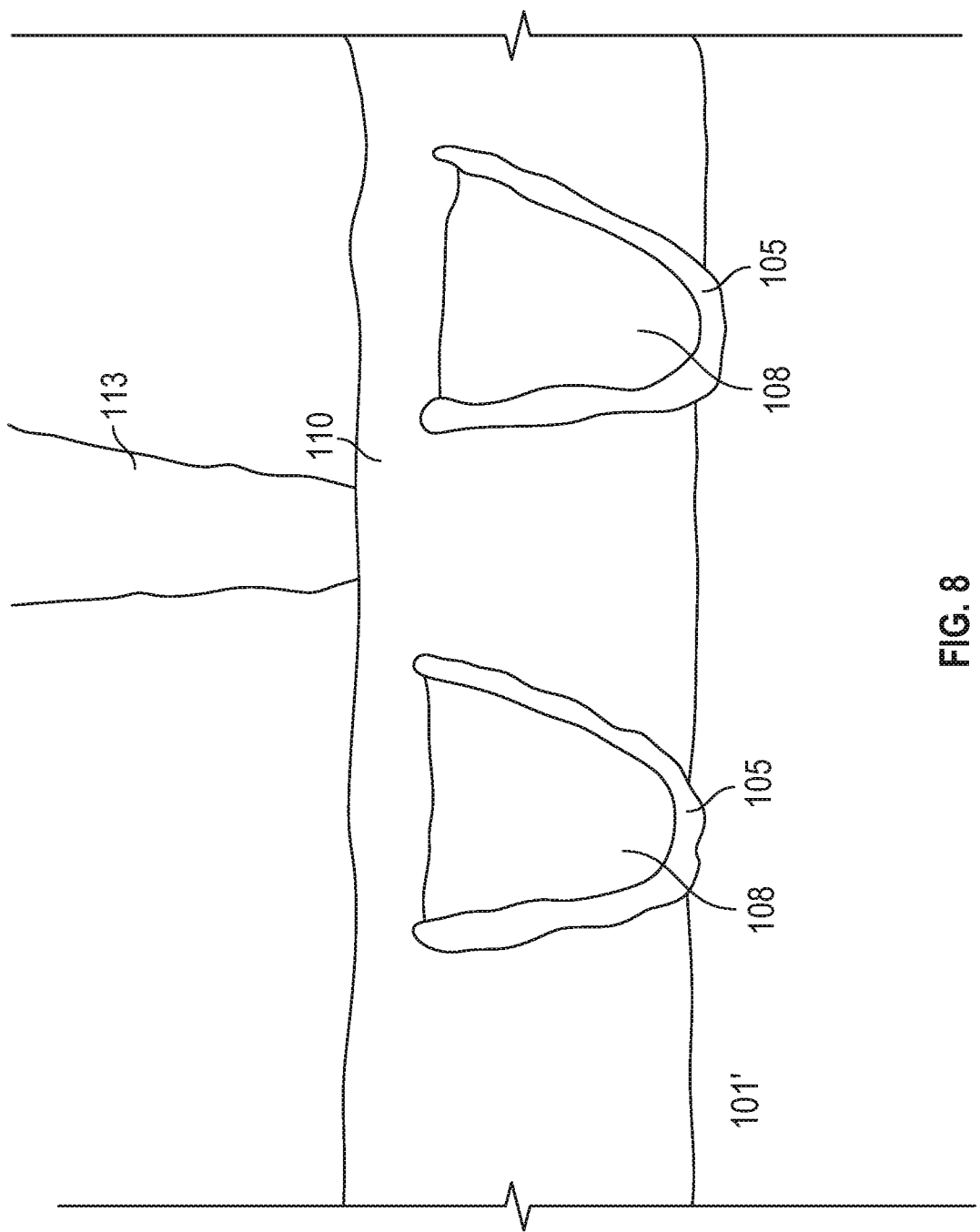
FIG. 8 includes a schematic representation of an embodiment.

FIG. 8 includes a schematic representation of an embodiment. Similar to FIG. 1N (S-S'), the embodiment includes dielectric 108 adjacent 2D material 105. S/D metal 110 couples to contact 113. The 2D materials are on dielectric 101' (e.g., silicon dioxide). FIG. 8 provides non-orthogonal lines, round edges, and the like that are indicative of real world manufacturing.

Figure 5:
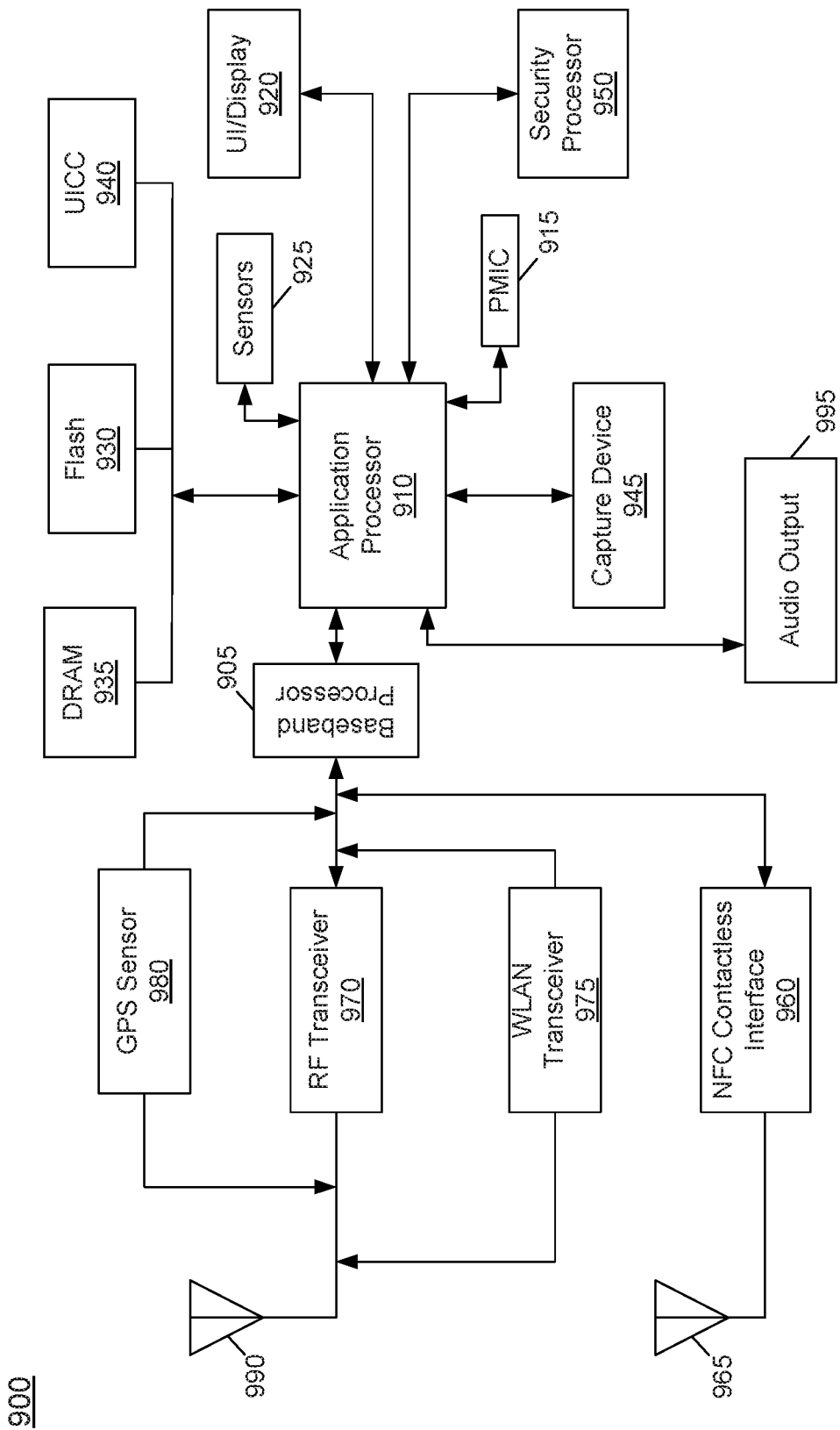
FIGS. 5, 6, and 7 depict systems that include embodiments of 2D transistors.

FIG. 5 includes a block diagram of an example system with which embodiments can be used. As seen, system 900 may be a smartphone or other wireless communicator or any other Internet of Things (IoT) device. A baseband processor 905 (which may include transistors described herein) is configured to perform various signal processing with regard to communication signals to be transmitted from or received by the system. In turn, baseband processor 905 is coupled to an application processor 910, which may be a main CPU (which may include transistors described herein) of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display) (which may include transistors described herein). In addition, application processor 910 may couple to a memory system including a non-volatile memory (which may include transistors described herein), namely a flash memory 930 and a system memory, namely a DRAM 935. As further seen, application processor 910 also couples to a capture device 945 such as one or more image capture devices that can record video and/or still images.

A universal integrated circuit card (UICC) 940 (which may include transistors described herein) comprises a subscriber identity module, which in some embodiments includes a secure storage to store secure user information. System 900 may further include a security processor 950 (e.g., Trusted Platform Module (TPM)) (which may include transistors described herein) that may couple to application processor 910. A plurality of sensors 925 (which may include transistors described herein), including one or more multi-axis accelerometers may couple to application processor 910 to enable input of a variety of sensed information such as motion and other environmental information. In addition, one or more authentication devices may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 (which may include transistors described herein) couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more internet of things (IoT) networks, various circuits may be coupled between baseband processor 905 and antenna 990. Specifically, a radio frequency (RF) transceiver 970 (which may include transistors described herein) and a wireless local area network (WLAN) transceiver 975 (which may include transistors described herein) may be present. In general, RF transceiver 970 may be used to receive and transmit wireless data and calls according to a given wireless communication protocol such as 3G, 4G, or 5G wireless communication protocol such as in accordance with a code division multiple access (CDMA), global system for mobile communication (GSM), long term evolution (LTE) or other protocol. In addition a GPS sensor 980 (which may include transistors described herein) may be present, with location information being provided to security processor 950. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 6:
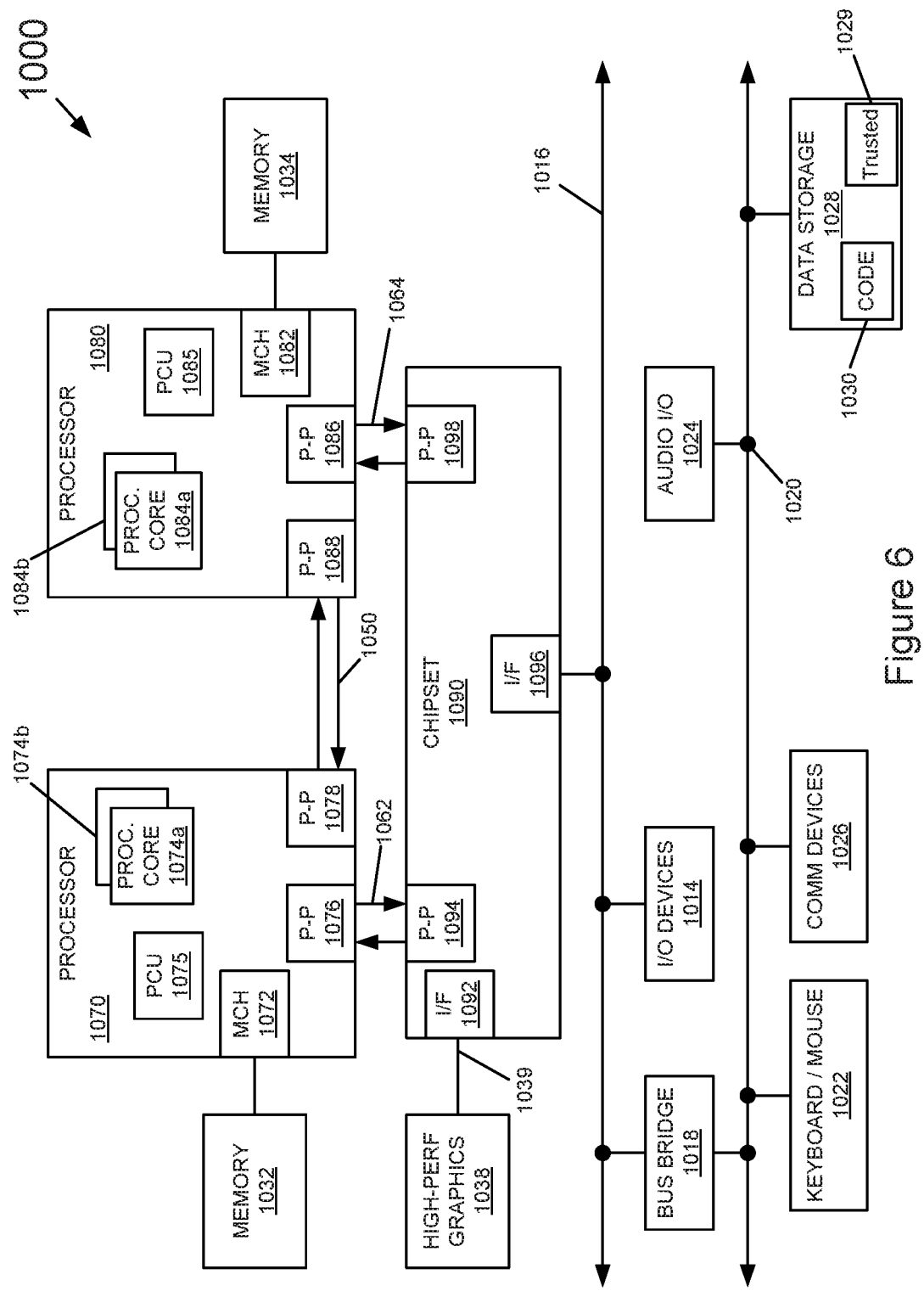

FIG. 6 shows a block diagram of a system in accordance with another embodiment of the present invention. Multiprocessor system 1000 is a point-to-point interconnect system such as a server system, and includes a first processor 1070 and a second processor 1080 coupled via a point-to-point interconnect 1050. Each of processors 1070 and 1080 may be multicore processors (which may include transistors described herein) such as SoCs, including first and second processor cores (i.e., processor cores 1074*a* and 1074*b* and processor cores 1084*a* and 1084*b*), although potentially many more cores may be present in the processors. In addition, processors 1070 and 1080 each may include power controller unit 1075 and 1085. In addition, processors 1070 and 1080 each may include a secure engine to perform security operations such as attestations, IoT network onboarding or so forth.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034, which may be portions of main memory (e.g., a DRAM) locally attached to the respective processors. First processor 1070 and second processor 1080 may be coupled to a chipset 1090 (which may include transistors described herein) via P-P interconnects 1062 and 1064, respectively. Chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 (which may include transistors described herein) such as a non-volatile storage or other mass storage device. As seen, data storage unit 1028 may include code 1030, in one embodiment. As further seen, data storage unit 1028 also includes a trusted storage 1029 to store sensitive information to be protected. Further, an audio I/O 1024 may be coupled to second bus 1020.

Figure 7:
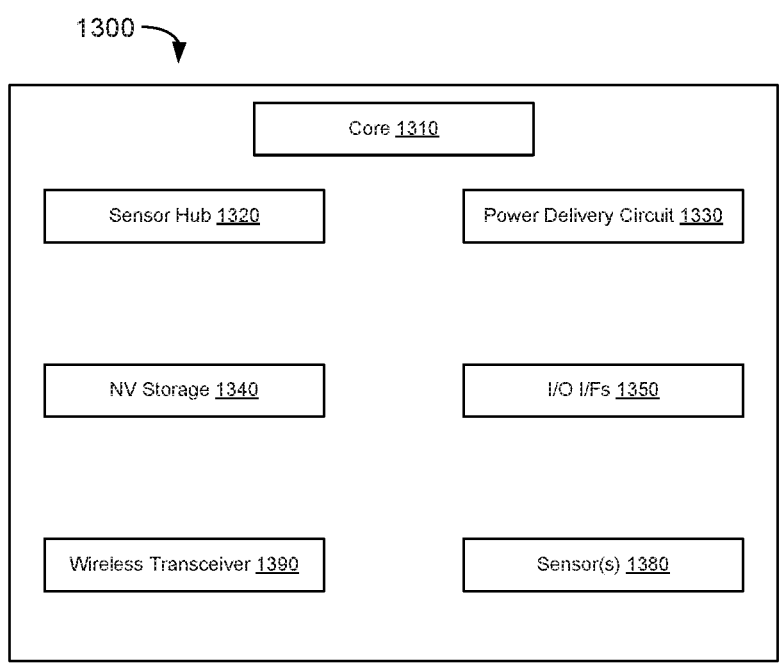

FIG. 7 depicts an IoT environment that may include wearable devices or other small form factor IoT devices. In one particular implementation, wearable module 1300 (which may include transistors described herein) may be an Intel® Curie™ module that includes multiple components adapted within a single small module that can be implemented as all or part of a wearable device. As seen, module 1300 includes a core 1310 (of course in other embodiments more than one core may be present). Such a core may be a relatively low complexity in-order core, such as based on an Intel Architecture® Quark™ design. In some embodiments, core 1310 may implement a Trusted Execution Environment (TEE). Core 1310 couples to various components including a sensor hub 1320 (which may include transistors described herein), which may be configured to interact with a plurality of sensors 1380, such as one or more biometric, motion environmental or other sensors. A power delivery circuit 1330 (which may include transistors described herein) is present, along with a non-volatile storage 1340 (which may include transistors described herein). In an embodiment, this circuit may include a rechargeable battery and a recharging circuit, which may in one embodiment receive charging power wirelessly. One or more input/output (IO) interfaces 1350, such as one or more interfaces compatible with one or more of USB/SPI/I2C/GPIO protocols, may be present. In addition, a wireless transceiver 1390, which may be a Bluetooth™ low energy or other short-range wireless transceiver is present to enable wireless communications as described herein. In different implementations a wearable module can take many other forms. Wearable and/or IoT devices have, in comparison with a typical general purpose CPU or a GPU, a small form factor, low power requirements, limited instruction sets, relatively slow computation throughput, or any of the above.

The following examples pertain to further embodiments.

Example 1a

An apparatus comprising: a dielectric material including fixed charges, the fixed charges each having a first polarity; a channel comprising a channel material, the channel material including a monolayer of a 2-dimensional (2D) material; a drain node; and a source node including a source material, the source material including at least one of the monolayer of the 2D material and a monolayer of an additional 2D material; wherein the source material: (a) includes charges each having a second polarity that is opposite the first polarity, (b) directly contacts the dielectric material.

As used herein, a "fixed charge" can be a positive or negative charge center whose position in space is generally fixed (i.e., unaltered by the application of a bias voltage or operation temperature fluctuations). For instance, a fixed charge may be due to (a) a missing atom in a dielectric, or (b) an interstitial atom that acts as a source of electric field. As another example, a "fixed charge" can be a polarization charge in an insulating ferroelectric material.

As used herein, the definition of a "monolayer" of a 2D material depends on the number of elements present in a material. For example, for materials such as graphene, phosphorene, and silicene (which are made up of only one element such as carbon, phosphorus, and silicon atoms respectively) a monolayer is a sheet of atoms where the atoms are bonded to each other by ionic or covalent bonds. For example, for transition metal chalcogenides (which contain more than one element such as transition metal atom and a chalcogen atom) a monolayer is a sheet including both a transition metal atom (molybdenum, tungsten, tin, and bismuth) and a chalcogen atom (sulfur, selenium, tellurium, and polonium) bonded to other atoms within the sheet through ionic or covalent bonds.

For example, with a $SiN_x$ providing positive fixed charges the source/drain may have negative charges (i.e., the source/drain are n-doped (n-type) due to electron doping). Altering the amount of positive fixed charges in the dielectric will alter the severity of doping in the source/drain.

Embodiments may include channels with no more than 1, 2, 3, 4, 5, 6 or 7 monolayers of thickness. These monolayers (also sometimes referred to herein as sheets) are bonded to each other van der Waals forces. 1, 2, 3, 4, 5, 6 or 7 monolayers may total no more than 10 nm of thickness in some embodiments.

As used herein, 2D materials are materials that are made of multiple sheets (monolayers) of material held together by van der Waals forces. Within each constituent sheet the atoms are held together by strong ionic/covalent bonds. Due to the weak strength of van der Waals forces the sheets can be easily separated from bulk materials to create atomically thin sheets. A 2D material may include 1, 2, 3, 4, 5, 6 or 7 monolayers and may total no more than 10 nm of thickness in some embodiments.

Another version of Example 1a: An apparatus comprising: a dielectric material including charges, the charges each having a first polarity; a channel comprising a channel material, the channel material including a 2-dimensional (2D) material; a drain node; and a source node including a source material, the source material including at least one of the 2D material and an additional 2D material; wherein the source material: (a) includes charges each having a second polarity that is opposite the first polarity, (b) directly contacts the dielectric material.

Example 2a

The apparatus of example 1a comprising: a gate; an additional dielectric material; and a trench included in the additional dielectric material; wherein the channel material is included within the trench.

Example 3a

The apparatus of example 2a, wherein: the trench includes first, second, and third walls; the first and second sidewalls are opposing sidewalls of the trench; the third wall couples the first sidewall to the second sidewall; the channel material includes: (a) a first channel material portion on the first wall, (b) a second channel material portion on the second wall, and (c) a third channel material portion on the third wall; the gate is between the first channel material portion and the second channel material portion; the channel has a long axis, the long axis defining a length of the channel; the channel has a short axis that is orthogonal to the long axis, the short axis defining a width of the channel; an additional axis is parallel to the short axis, the additional axis intersecting the gate and the first and second channel material portions but not the third channel material portion.

Example 4a

The apparatus of example 3a, wherein the length of the channel is less than 10 nanometers.

Example 5a

The apparatus of example 2a, wherein the monolayer of 2D material includes a monolayer of a transition metal dichalcogenide (TMD).

Example 6a

The apparatus of example 2a wherein the source material includes the monolayer of an additional 2D material.

Example 7a

The apparatus of example 6a wherein: a majority of the source material has a first lattice constant; a majority of the channel material has a second lattice constant; the first lattice constant is unequal to the second lattice constant.

Another version of Example 7a: The apparatus of example 6a wherein: a majority of the source material has a first band structure; a majority of the channel material has a second band structure; the first band structure being unequal to the second band structure.

Example 8a

The apparatus of example 6a wherein the source material directly contacts the channel material.

Example 9a

The apparatus of example 6a wherein drain node includes a drain material, the drain material including the monolayer of an additional 2D material.

Example 10a

The apparatus of example 2a wherein: the drain node includes a drain material; the drain material includes the monolayer of an additional 2D material.

Example 11a

The apparatus of example 2a wherein: the drain node includes a drain material; and the drain material directly contacts the dielectric material.

Example 12a

The apparatus of example 2a, wherein: the channel has a long axis, the long axis defining a length of the channel; the monolayer of 2D material is less than five atoms in height, the height being orthogonal to the long axis.

Example 13a

The apparatus of example 2a, wherein: the channel has a long axis, the long axis defining a length of the channel; the monolayer of 2D material is less than 10 Angstroms in height, the height being orthogonal to the long axis.

Example 14a

The apparatus of example 2a, wherein: the channel includes a material portion that comprises at least one and no more than four additional monolayers of the 2D material; the material portion is between the monolayer of the 2D material and the dielectric material.

Example 15a

The apparatus of example 2a, wherein: the 2D material includes at least one of (a) molybdenum and sulfur, (b) tungsten and sulfur, (c) tungsten and selenium, (d) molybdenum and tellurium, (e) tungsten and tellurium, (f) phosphorus, (g) graphene, (f) silicene, (g) germanene, (h) tin and sulfur, (i) tin and selenium, (j) hafnium and sulfur, (k) hafnium and selenium, (l) zirconium and sulfur, (m) zirconium and sulfur, and (n) combinations thereof.

Example 16a

The apparatus of example 2a wherein: the source node, the drain node, and the channel are included in a planar transistor; a plane intersects each of source node, the drain node, and the channel.

Example 17a

The apparatus of example 2a comprising: a gate dielectric that directly contacts the gate; and a spacer dielectric that directly contacts both the gate dielectric and the dielectric material.

Example 18a

The apparatus of example 2a wherein a majority of an outer surface of the channel material does not directly contact the dielectric material.

Example 19a

The apparatus of example 2a wherein the dielectric material includes a non-stoichiometric material.

In various embodiments the dielectric material with fixed charges may include (a) doped oxides (charged dopant atoms incorporated into the dielectric layer next to source), (b) ferroelectric oxide layer with a permanent polarization charge, or (c) non-stoichiometric material. The dielectric with fixed charges may also include nitrides and other such dielectric materials.

As used herein, "non-stoichiometric" compounds are chemical compounds having an elemental composition whose proportions deviate from the ideal composition. The deviation from ideal composition for embodiments described herein refers to a defect density that creates a doping density in the source material greater than 1e19 $cm^{-3}$. For example, in such materials some small percentage of atoms are missing or too many atoms are packed into an otherwise perfect lattice work.

Example 1b

An apparatus comprising: a dielectric material including fixed charges, the fixed charges each having a first polarity; a channel comprising a channel material, the channel material including a 2-dimensional (2D) material; a drain node; and a source node including a source material, the source material including at least one of the 2D material and an additional 2D material; wherein the source material: (a) includes charges each having a second polarity that is opposite the first polarity, (b) directly contacts the dielectric material.

Example 2b

The apparatus of example 1b wherein a thickness of the 2D material included in the channel material is less than 10 nm.

Another version of Example 2b: The apparatus of claim 1 wherein a thickness of the 2D material included in the source material is less than 10 nm.

Example 3b

The apparatus of example 2b, wherein: a length of the channel is parallel to a long axis of the channel, a width of the channel is orthogonal to the length of the channel, and a height of the channel is orthogonal to the length of the channel and the width of the channel, the long axis defining a length of the channel; the length of the channel is less than 10 nanometers; the thickness of the 2D material is less than the height of the channel.

Example 4b

The apparatus of example 2b comprising: a gate; an additional dielectric material; and a trench included in the additional dielectric material; wherein the channel material is included within the trench.

Example 5b

The apparatus of example 4b, wherein: the trench includes first, second, and third walls; the first and second sidewalls are opposing sidewalls of the trench; the third wall couples the first sidewall to the second sidewall; the channel material includes: (a) a first channel material portion on the first wall, (b) a second channel material portion on the second wall, and (c) a third channel material portion on the third wall; the gate is between the first channel material portion and the second channel material portion; an additional axis is orthogonal to the long axis, the additional axis intersecting the gate and the first and second channel material portions but not the third channel material portion.

Example 6b

The apparatus of example 4b comprising: a gate dielectric that directly contacts the gate; and a spacer dielectric that directly contacts both the gate dielectric and the dielectric material.

Example 7b

The apparatus of example 2b, wherein: the 2D material includes a transition metal dichalcogenide (TMD); the TMD includes at least one of (a) molybdenum and sulfur, (b) tungsten and sulfur, (c) tungsten and selenium, (d) molybdenum and tellurium, (e) tungsten and tellurium, (f) tin and sulfur, (g) tin and selenium, (h) hafnium and sulfur, (i) hafnium and selenium, (j) zirconium and sulfur, (k) zirconium and sulfur, and (l) combinations thereof.

Example 8b

The apparatus of example 2b, wherein the 2D material includes at least one of phosphorene, graphene, silicene, and germanene.

Example 9b

The apparatus of example 2b wherein the source material includes the additional 2D material.

Example 10b

The apparatus of example 2b wherein: a majority of the source material has a first lattice constant; a majority of the channel material has a second lattice constant; the first lattice constant is unequal to the second lattice constant.

Example 11b

The apparatus of example 2b wherein the source material directly contacts the channel material.

Example 12b

The apparatus of example 2b wherein the drain node includes a drain material, the drain material including the additional 2D material.

Example 13b

The apparatus of example 2b wherein: the drain node includes a drain material; the drain material directly contacts the dielectric material; the drain material includes charges that each has one of the first and second polarities.

Example 14b

The apparatus of example 2b wherein a thickness of the source material is substantially equal to the thickness of the 2D material included in the channel material.

Example 15b

The apparatus of example 2b, wherein the thickness of the 2D material included in the channel material is less than 15 atoms.

Example 16b

The apparatus of example 2b, wherein the thickness of the 2D material included in the channel material is less than 5 monolayers.

Another version of Example 16b: The apparatus of claim 2, wherein the thickness of the 2D material included in the channel material is no more than 5 monolayers.

Example 17b

The apparatus of example 2b wherein the channel material includes at least one layer of the 2D material and no more than 5 layers of the 2D material.

Example 18b

The apparatus of example 2b, wherein the 2D material at least one of crystalline and poly-crystalline.

Example 19b

The apparatus of example 2b wherein: the source node, the drain node, and the channel are included in a planar transistor; a plane, parallel to a long axis of the channel, intersects each of source node, the drain node, and the channel.

Example 20b

The apparatus of example 2b wherein: a majority of a first surface of the channel material does not directly contact the dielectric material; a majority of a second surface of the channel material directly contacts a gate dielectric; the first and second surfaces oppose one another.

Example 21b

The apparatus of example 2b wherein the dielectric material includes $SiN_x$.

Example 22b

The structure of example 2b wherein the fixed charges of the dielectric material includes positive charge centers.

Example 23b

The structure of example 2b wherein the fixed charges of the dielectric material includes negative charge centers.

Another version of example 23b: A system comprising: a memory; and a processor coupled to the memory, wherein at least one of the processor and the memory include a transistor according to claim 1.

Example 24b

A method comprising: forming two fins from a first dielectric material, the two fins defining a trench between the two fins; forming a first material within a channel portion of the trench; forming a second material within a source portion of the trench, the second material including a 2 dimensional (2D) material; forming a second dielectric material on the second material and within the source portion of the trench, wherein the second dielectric material is not formed within the channel portion of the trench; forming a source metal on the second material and the second dielectric material; forming a gate dielectric material within the channel portion of the trench; forming a gate metal on the gate dielectric material and within the channel portion of the trench.

Example 25b

The method of example 24b, wherein: the first material includes a metal; the method further comprises: forming a third material within the channel portion of the trench, the third material including at least one of the 2D material and an additional 2D material; forming the gate dielectric material on the third material.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An integrated circuit device comprising:
a dielectric material including fixed charges, the fixed charges having a first polarity;
a channel comprising a channel material, the channel material including a 2-dimensional (2D) material;
a drain node;
a source node including a source material, the source material including at least one of the 2D material, an additional 2D material, or combinations thereof;
a gate;
an additional dielectric material; and
a trench included in the additional dielectric material;
wherein the channel material is included within the trench;
wherein a thickness of the at least one of the 2D material, an additional 2D material, or combinations thereof included in the source material is less than 10 nm;
wherein the source material: (a) includes charges having a second polarity that is opposite the first polarity, (b) directly contacts the dielectric material.

2. The integrated circuit device of claim 1, wherein:
a length of the channel is parallel to a long axis of the channel, a width of the channel is orthogonal to the length of the channel, and a height of the channel is orthogonal to the length of the channel and the width of the channel, the long axis defining the length of the channel;
the length of the channel is less than 20 nanometers;
the thickness of the at least one of the 2D material, an additional 2D material, or combinations thereof included in the source material is less than the height of the channel.

3. The integrated circuit device of claim 1, wherein:
the trench includes first, second, and third walls;
the first and second sidewalls are opposing sidewalls of the trench;
the third wall couples the first sidewall to the second sidewall;
the channel material includes: (a) a first channel material portion on the first wall, (b) a second channel material portion on the second wall, and (c) a third channel material portion on the third wall;
the gate is between the first channel material portion and the second channel material portion;
an axis is orthogonal to a long axis of the channel, the axis intersecting the gate and the first and second channel material portions but not the third channel material portion.

4. The integrated circuit device of claim 1 comprising:
a gate dielectric that directly contacts the gate; and
a spacer dielectric that directly contacts both the gate dielectric and the dielectric material.

5. The integrated circuit device of claim 1, wherein:
the 2D material includes a transition metal dichalcogenide (TMD);
the TMD includes at least one of (a) molybdenum and sulfur, (b) tungsten and sulfur, (c) tungsten and selenium, (d) molybdenum and tellurium, (e) tungsten and tellurium, (f) tin and sulfur, (g) tin and selenium, (h) hafnium and sulfur, (i) hafnium and selenium, (j) zirconium and sulfur, (k) zirconium and sulfur, or combinations thereof.

6. The integrated circuit device of claim 1, wherein the 2D material includes at least one of phosphorene, graphene, silicene, germanene, or combinations thereof.

7. The integrated circuit device of claim 1 wherein the source material directly contacts the channel material.

8. The integrated circuit device of claim 1 wherein:
the drain node includes a drain material;
the drain material directly contacts the dielectric material;
the drain material includes charges that have one of the first or second polarities.

9. The integrated circuit device of claim 1 wherein a thickness of the source material is substantially equal to the thickness of the 2D material included in the channel material.

10. The integrated circuit device of claim 1, wherein the thickness of the 2D material included in the channel material is less than 15 atoms.

11. The integrated circuit device of claim 1, wherein the thickness of the 2D material included in the channel material is no more than 5 monolayers.

12. The integrated circuit device of claim 1 wherein the channel material includes at least one layer of the 2D material and no more than 5 layers of the 2D material.

13. The integrated circuit device of claim 1, wherein the 2D material is at least one of crystalline or poly-crystalline.

14. The integrated circuit device of claim 1 wherein:
the source node, the drain node, and the channel are all included in a planar transistor;

a plane, parallel to a long axis of the channel, intersects the source node, the drain node, and the channel.

15. The integrated circuit device of claim 1 wherein:
a majority of a first surface of the channel material does not directly contact the dielectric material;
a majority of a second surface of the channel material directly contacts a gate dielectric;
the first and second surfaces oppose one another.

16. The integrated circuit device of claim 1 wherein the dielectric material includes $SiN_x$.

17. The integrated circuit device of claim 1 wherein the fixed charges of the dielectric material include positive charge centers.

18. A system comprising:
a memory; and
a processor coupled to the memory,
wherein at least one of the processor or the memory include the integrated circuit device according to claim 1.

19. An integrated circuit device comprising:
a dielectric material including fixed charges, the fixed charges having a first polarity;
a channel comprising a channel material, the channel material including a 2-dimensional (2D) material;
a drain node; and
a source node including a source material, the source material including at least one of the 2D material, an additional 2D material, or combinations thereof;
wherein the source material: (a) includes charges having a second polarity that is opposite the first polarity, (b) directly contacts the dielectric material;
wherein a thickness of the at least one of the 2D material, an additional 2D material, or combinations thereof included in the source material is less than 10 nm;
wherein: (a) a majority of a first surface of the channel material does not directly contact the dielectric material; (b) a majority of a second surface of the channel material directly contacts a gate dielectric; and (c) the first and second surfaces oppose one another.

20. The integrated circuit device of claim 19, wherein:
a length of the channel is parallel to a long axis of the channel, a width of the channel is orthogonal to the length of the channel, and a height of the channel is orthogonal to the length of the channel and the width of the channel, the long axis defining the length of the channel;
the length of the channel is less than 20 nanometers;
the thickness of the at least one of the 2D material, an additional 2D material, or combinations thereof included in the source material is less than the height of the channel.

21. The integrated circuit device of claim 20, wherein the 2D material includes at least one of (a) molybdenum and sulfur, (b) tungsten and sulfur, (c) tungsten and selenium, (d) molybdenum and tellurium, (e) tungsten and tellurium, (f) tin and sulfur, (g) tin and selenium, (h) hafnium and sulfur, (i) hafnium and selenium, (j) zirconium and sulfur, (k) zirconium and sulfur, (l) phosphorene, (m) graphene, (n) silicene, (o) germanene, or combinations thereof.

22. The integrated circuit device of claim 20 wherein the fixed charges of the dielectric material include positive charge centers.

23. An integrated circuit device comprising:
a dielectric material including fixed charges, the fixed charges having a first polarity;
a channel comprising a channel material, the channel material including a 2-dimensional (2D) material;
a drain node; and
a source node including a source material, the source material including at least one of the 2D material, an additional 2D material, or combinations thereof;
wherein the source material: (a) includes charges having a second polarity that is opposite the first polarity, and (b) directly contacts the dielectric material;
wherein a thickness of the at least one of the 2D material, an additional 2D material, or combinations thereof included in the source material is less than 10 nm;
wherein: (a) a length of the channel is parallel to a long axis of the channel, a width of the channel is orthogonal to the length of the channel, and a height of the channel is orthogonal to the length of the channel and the width of the channel, the long axis defining the length of the channel; (b) the length of the channel is less than 20 nanometers; and (c) the thickness of the at least one of the 2D material, an additional 2D material, or combinations thereof included in the source material is less than the height of the channel.

24. The integrated circuit device of claim 23, wherein the 2D material includes at least one of (a) molybdenum and sulfur, (b) tungsten and sulfur, (c) tungsten and selenium, (d) molybdenum and tellurium, (e) tungsten and tellurium, (f) tin and sulfur, (g) tin and selenium, (h) hafnium and sulfur, (i) hafnium and selenium, (j) zirconium and sulfur, (k) zirconium and sulfur, (l) phosphorene, (m) graphene, (n) silicene, (o) germanene, or combinations thereof.

25. The integrated circuit device of claim 23, wherein the length of the channel is less than 10 nanometers.

* * * * *